(12) United States Patent
Vrtis et al.

(10) Patent No.: US 10,009,992 B2
(45) Date of Patent: Jun. 26, 2018

(54) PCB HYBRID REDISTRIBUTION LAYER

(71) Applicant: Multek Technologies Limited, San Jose, CA (US)

(72) Inventors: Joan K. Vrtis, Mesa, AZ (US); Michael James Glickman, Mountain View, CA (US); Todd Robinson, San Mateo, CA (US); Hollese Galyon, Beaverton, OR (US)

(73) Assignee: Multek Technologies Limited, San Jose, CA (US)

( * ) Notice: Subject to any disclaimer, the term of this patent is extended or adjusted under 35 U.S.C. 154(b) by 0 days. days.

(21) Appl. No.: 15/367,679

(22) Filed: Dec. 2, 2016

(65) Prior Publication Data

US 2017/0164458 A1    Jun. 8, 2017

Related U.S. Application Data

(60) Provisional application No. 62/308,596, filed on Mar. 15, 2016, provisional application No. 62/262,299, filed on Dec. 2, 2015.

(51) Int. Cl.
*H05K 1/02* (2006.01)
*H05K 1/11* (2006.01)
(Continued)

(52) U.S. Cl.
CPC ......... *H05K 1/0201* (2013.01); *H05K 1/0271* (2013.01); *H05K 1/0298* (2013.01);
(Continued)

(58) Field of Classification Search
CPC .......................... H05K 1/0201; H05K 1/0298
See application file for complete search history.

(56) References Cited

U.S. PATENT DOCUMENTS 7,211,470 B2    5/2007    Card
7,342,183 B2    3/2008    Egitto
(Continued)

FOREIGN PATENT DOCUMENTS

JP    2008078454 A    4/2008
JP    2015012022 A    1/2015
(Continued)

OTHER PUBLICATIONS

Notice of Allowance dated Jul. 17, 2017, U.S. Appl. No. 14/572,636, filed Dec. 16, 2014, applicant.: Mark Bergman, 10 pages.
(Continued)

*Primary Examiner* — Timothy Thompson
*Assistant Examiner* — Amol Patel
(74) *Attorney, Agent, or Firm* — Haverstock & Owens LLP

(57) ABSTRACT

A hybrid PCB system has a hybrid redistribution layer that redistributes a large pad-to-pad pitch to a smaller, finer pad-to-pad pitch and applies hybrid materials to balance the thermal-mechanical stress. The hybrid PCB system combines wafer level packaging, IC substrate and high density PCB technologies within a single hybrid PCB. The hybrid PCB system addresses the opportunity for interconnect reliability, design and assembly of a electronic components with pad pitches less than 400 microns directly to a PCB without need of an IC substrate or interposer.

22 Claims, 4 Drawing Sheets

(51) Int. Cl.
*H05K 3/46* (2006.01)
*H05K 1/18* (2006.01)

(52) U.S. Cl.
CPC .............. *H05K 1/111* (2013.01); *H05K 1/115* (2013.01); *H05K 3/4602* (2013.01); *H01L 2224/16225* (2013.01); *H01L 2924/15311* (2013.01); *H05K 1/181* (2013.01); *H05K 2201/068* (2013.01)

(56) References Cited

U.S. PATENT DOCUMENTS

| | | | |
|---|---|---|---|
| 8,278,565 | B2 | 10/2012 | Honjo |
| 2004/0000425 | A1 | 1/2004 | White |
| 2006/0043567 | A1* | 3/2006 | Palanduz ............ H01L 21/4857 257/697 |
| 2007/0221404 | A1 | 9/2007 | Das |
| 2008/0217708 | A1 | 9/2008 | Reisner |
| 2009/0004438 | A1* | 1/2009 | Urakawa ................ B32B 18/00 428/172 |
| 2009/0301606 | A1 | 12/2009 | Ueshima |
| 2013/0069014 | A1 | 3/2013 | Lee |
| 2013/0209672 | A1 | 8/2013 | Reinmuth |
| 2014/0024147 | A1 | 1/2014 | Xie |
| 2014/0301053 | A1* | 10/2014 | Iida ..................... H05K 3/4629 361/760 |
| 2015/0114707 | A1 | 4/2015 | Glickman |
| 2016/0088729 | A1* | 3/2016 | Kobuke ............... H05K 3/4629 174/251 |

FOREIGN PATENT DOCUMENTS

| | | |
|---|---|---|
| KR | 10-0887133 B1 | 3/2009 |
| KR | 10-0891814 B1 | 4/2009 |
| KR | 100891814 B1 * | 4/2009 |

OTHER PUBLICATIONS

Non-final office action dated Jul. 25, 2017, U.S. Appl. No. 15/081,623, filed Mar. 25, 2016, applicant.: Mark Zhang, 14 pages.
Non-Final Office Action, dated Feb. 27, 2018, U.S. Appl. No. 15/087,793, filed Mar. 31, 2016, Applicant: Pui Yin Yu, 11 pages.

* cited by examiner

P=Pitch (distance between center of 2 adjacent pads)
L=copper trace (line width)
S=space (space between copper features)

PCB HYBRID REDISTRIBUTION LAYER

RELATED APPLICATIONS

This Patent Application claims priority under 35 U.S.C. 119(e) of the co-pending U.S. Provisional Patent Application, Application No. 62/308,596, filed on Mar. 15, 2016, and entitled "PCB-RDL IP," which is hereby incorporated by reference in its entirety. This Patent Application also claims priority under 35 U.S.C. 119(e) of the co-pending U.S. Provisional Patent Application, Application No. 62/262,299, filed on Dec. 2, 2015, and entitled "FINE FEATURE PRINTED CIRCUIT USING REVERSE REDISTRIBUTION LAYER," which is hereby incorporated by reference in its entirety.

FIELD OF THE INVENTION

The present invention is generally directed to printed circuit boards. More specifically, the present invention is directed to a printed circuit board having a hybrid redistribution layer.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with plated-through holes called vias, or microvias.

A printed circuit board includes a plurality of stacked layers, the layers made of alternating non-conductive layers and conductive layers. The non-conductive layers can be made of prepreg or base material that is part of a core structure, or simply core. Prepreg is a fibrous reinforcement material impregnated or coated with a resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack can be formed by a single lamination step or multiple lamination steps. Using a single lamination step, the laminated stack is formed by stacking multiple core structures with intervening prepreg and corresponding microvias, then laminating the stack. Microvias can be formed using laser or mechanical through hole drilling. Microvias have a conductive material that lines the inside walls to form a conductive path. Using multiple lamination steps, a laminated stack build up starts with a core structure. Microvias are formed in this core structure. Foil lamination cycles are then performed for as many layers as are needed, thereby forming alternating layers of patterned conducting interconnects and non-conducting (dielectric) layers, such as prepreg, laminated together, where the patterned conducting interconnects are connected by microvias through the non-conducting layers. Microvias can be stacked and connected on top of each other where the conductive elements of the microvia are in contact in each layer of the stack. The microvias are filled with materials such as conductives (using copper plating for example or filled with a conductive filled material that hardens with temperature or in air forming a conductive path) or insulating material in the via cavity area leaving the conductive microvia areas accessible for contact during stacking for a continous conductive path from microvia to microvia in the stack. Interconnections between conductive layers with laminates in between can be done by stacking microvias. After the laminated stack is formed, vias through the entire laminated stack can be formed by drilling a hole through the laminated stack and plating the wall of the hole with conductive material, such as copper. The resulting plating interconnects the conductive layers in the laminated stack. Conductive pads are formed on the top surface and/or bottom surface of the laminated stack for interconnecting with discrete electronic components, both active and passive.

Under ideal conditions, the attachment between an electronic component and the PCB is free of stress, thereby enabling optimal interconnection. In practice however, the attachment between the electronic component and the PCB is subject to many types of stress, any one or combination of which may lead to degradation of the interconnection and eventual failure. One such stress is thermal-mechanical stress, also referred to as residual stress, due to thermal mismatch between the various materials within the PCB, and also thermal mismatch between the PCB itself and the electronic device attached to the PCB, such as silicon, GaAs or GaN devices. Thermal-mechanical stresses can be native as well as heat induced. Thermal mechanical stress is inherent when two materials have a mismatch of the materials thermal expansion coefficient, which is observed when exposed to temperature changes. Some thermal-mechanical stresses are caused by the cure cycle, where the PCB shrinks as it cools after curing, and other thermal-mechanical stresses are due to thermal mismatches between attached layers of different materials. There can be thermal mismatches at room temperature and also when the PCB is heated. Heating occurs, for example, during a common solder reflow process where the temperature is about 250-265 degrees C. or up to 380 degrees C. There is a thermal mismatch at this elevated temperature as well as a thermal mismatch as the PCB cools. As the layers cool, they shrink at different rates. These are processing related thermal-mechanical stresses. There are also thermal-mechanical stresses due to thermal mismatches when there is heating during operational use of the PCB, for example a mounted IC chip generates heat when in use. There are also environmental changes in temperature when the PCB is used in non-controlled environments, for example an automotive application may subject the PCB to outside temperatures that range from minus 40 degrees C. to 125 degrees C. This leads to long term environmental impact.

Current PCB technology is limited to fine feature pad pitches as low as 400 microns in high volume, conductive transmission line traces with widths as low as 40 microns and spaces between the such circuit features as low as 40 microns. For some electronic components, the pad sizes on PCBs are larger than the corresponding pads of the attached electronic components, interconnected by bumps attached to the pads on the electronic component. In order to assemble the smaller pad pitch electronic component to the larger pad pitch PCB, the electronic component is assembled onto an interposer or IC substrate, similar in configuration to BGA (ball grid array) IC chips and in some cases fabricated as a Wafer Level Chip Scale package. The IC substrate is used to connect the electronic component to the standard PCB structure. The IC substrate essentially functions as a redistribution layer. The IC substrate is a packaged component having pads on the top surface that have dimensions to match the bumps of the BGA electronic component, and bumps on the bottom surface that have larger pitch to match the larger pad sizes on the PCB. Between the top surface and the bottom surface of the IC substrate are multiple layers that increase the circuit feature dimensions from the top surface to the bottom surface and provide fan out interconnects from the top surface pads to the bottom surface bumps. The IC substrate allows for the electronic device an electrical pathway to optimize its functionality.

FIG. 1 illustrates a conventional configuration for interconnecting a smaller featured electronic component to a larger featured standard PCB using an IC substrate. A standard PCB 2 includes a laminated stack 4 having a plurality of stacked layers and multiple contact pads 6 on a top surface. An IC substrate 8 includes a substrate 9 made of multiple redistribution layers, multiple bumps 10 on a bottom surface coupled to the multiple contact pads 4 of the standard PCB 2, and multiple contact pads 12 on a top surface. An electronic component 14 includes multiple bumps 16 coupled to the multiple contact pads 12 of the IC substrate 8. The pad size and pad pitch on the top surface of the standard PCB 2 substantially match the corresponding circuit feature sizes on the bottom surface of the IC substrate 8, and the pad size and pad pitch on the top surface of the IC substrate 8 substantially match the corresponding circuit feature sizes on the bottom surface of the electronic component 14. The circuit feature sizes of the electronic component 14 are smaller than the circuit feature sizes of the standard PCB 2.

An IC substrate is often fabricated using processing similar to PCB but with different materials and far smaller features, such as a 8 micron line/space. This process and material is very expensive. These processes and materials are more expensive to implement than PCB technologies and materials used to make a standard PCB. Additionally, use of an IC substrate as a redistribution layer adds more cost to the overall electronic package as there are now two layers of component-level interconnects, a first component-level interconnect layer between the PCB and the IC substrate and second component-level interconnect layer between the IC substrate and the electronic component. Further, using an IC substrate increases the height (overall thickness) due to the extra packaging and bumps. Also, each electronic component to be attached needs an IC substrate which reduces the density of electronic components that can be attached onto the PCB. The IC substrate is also an interposer which may negatively impacts signal integrity.

SUMMARY OF THE INVENTION

A hybrid PCB system has a hybrid redistribution layer that redistributes a large pad-to-pad pitch to a smaller, finer pad-to-pad pitch and applies hybrid materials to balance and dissipate the residual stress. The hybrid PCB system combines wafer level packaging, IC substrate and high density PCB technologies within a single hybrid PCB.

The hybrid PCB system addresses the opportunity for interconnect reliability, design and assembly of a electronic components with pad pitches less than 400 microns, and in particular with pad pitches less than 350 microns, directly to a PCB without need of an IC substrate or interposer. The hybrid PCB system reduces the overall electronic package form factor (x, y, z dimensions). The hybrid PCB system also reduces a layer of component-level interconnects from two component-level interconnect layers to one component-level interconnect layer as the electronic component may be mounted directly onto the hybrid PCB. In addition to enabling direct electronic component attachment, the hybrid PCB system reduces the line width and spacing needed for miniaturization and increased circuit density that is the trend in the electronics industry.

In an aspect, a printed circuit board is disclosed. The printed circuit board includes a stack having a plurality of alternating non-conductive layers and conductive layers. The stack has a coefficient of thermal expansion value at a center portion and a reducing coefficient of thermal expansion value as the stack extends toward an outer surface. In some embodiments, the center portion has a first coefficient of thermal expansion value and an outer portion of the stack that includes the outer surface has a second coefficient of thermal expansion value that is less than the first coefficient of thermal expansion value. In some embodiments, the center portion has a first coefficient of thermal expansion value, an intermediate portion of the stack adjacent to the center portion has a second coefficient of thermal expansion value that is less than the first coefficient of thermal expansion value, and an outer portion of the stack that includes the outer surface and is adjacent to the intermediate portion has a third coefficient of thermal expansion value that is less than the second coefficient of thermal expansion value.

In another aspect, another printed circuit board is disclosed. The printed circuit board includes an inner core structure, a buffer layer, an intermediate layer, an outer layer and an outer conductive layer. The inner core structure includes a laminated stack of a plurality of non-conductive layers and a plurality of conductive layers. The plurality of non-conductive layers have a first coefficient of thermal expansion value. The buffer layer is laminated to the inner core structure. The buffer layer comprises a first dielectric material having a second coefficient of thermal expansion value less than the first coefficient of thermal expansion value. The intermediate conductive layer is coupled to the buffer layer. The outer layer is coupled to the intermediate conductive layer and the buffer layer. The outer layer comprises a second dielectric material having a third coefficient of expansion value less than the second coefficient of thermal expansion value. The outer conductive layer is coupled to the outer layer. In some embodiments, the plurality of non-conductive layers have a first elastic modulus value, the buffer layer has a second elastic modulus value and the outer layer has a third elastic modulus value, further wherein the second elastic modulus value is less than the first elastic modulus value and the second elastic modulus value is less than the third elastic modulus value. In some embodiments, the plurality of conductive layers includes an inner core structure outer surface conductive layer, and the intermediate conductive layer is coupled to the inner core structure outer surface conductive layer by one or more first conductive microvias. In some embodiments, the outer conductive layer is coupled to the intermediate conductive layer by one or more second conductive microvias. In some embodiments, the inner core structure outer surface includes a plurality of inner core structure circuit features each having corresponding inner core structure circuit feature dimensions. In some embodiments, each of the plurality of the inner core structure circuit features comprise one of a contact pad, a trace transmission line or a via end. In some embodiments, the outer conductive layer includes a plurality of outer layer circuit features each having corresponding outer surface circuit feature dimensions. In some embodiments, the outer surface circuit feature dimensions are smaller than the inner core structure circuit feature dimensions. In some embodiments, the buffer layer comprises a plurality of different materials blended together, each of the different materials having a different coefficient of thermal expansion value, and the buffer layer has a second composite coefficient of thermal expansion value. In some embodiments, the outer layer comprises a plurality of different materials blended together, each of the different materials having a different coefficient of thermal expansion value, and the outer layer has a third composite coefficient of thermal expansion value. In some embodiments, the buffer layer comprises a plurality of first dielectric material layers each separated by a conductive layer. In some embodiments, the conductive layers separating each of the plurality of first dielectric material layers are selectively interconnected by a plurality of conductive microvias. In some embodiments, the outer layer comprises a plurality of second dielectric material layers each separated by a conductive layer. In some embodiments, the conductive layers separating each of the plurality of second dielectric material layers are selectively interconnected by a plurality of conductive microvia. In some embodiments, the intermediate conductive layer is applied to the buffer layer and the outer conductive layer is coupled to the outer layer using one of a semi-additive process, an advanced modified semi-additive process or fully additive process. In some embodiments, the inner core structure is fabricated using standard printed circuit board processes and the buffer layer, the intermediate conductive layer, the outer layer and the outer conductive layer are fabricated using integrated circuit substrate processes. In yet another aspect, another printed circuit board is disclosed. The printed circuit board includes an inner core structure, an outer layer and an outer conductive layer. The inner core structure includes a laminated stack of a plurality of non-conductive layers and a plurality of conductive layers. The plurality of non-conductive layers have a first coefficient of thermal expansion value. The outer layer is coupled to the inner core structure. The outer layer comprises a dielectric material having a second coefficient of expansion value less than the first coefficient of thermal expansion value. The outer conductive layer is coupled to the outer layer. In some embodiments, the plurality of non-conductive layers have a first elastic modulus value and the outer layer has a second elastic modulus value, further wherein the second elastic modulus value is less than the first elastic modulus value. In some embodiments, the plurality of conductive layers includes an inner core structure outer surface conductive layer, and the outer conductive layer is coupled to the inner core structure outer surface conductive layer by one or more conductive microvias. In some embodiments, the inner core structure outer surface includes a plurality of inner core structure circuit features each having corresponding inner core structure circuit feature dimensions. In some embodiments, each of the plurality of the inner core structure circuit features comprise one of a contact pad, a trace transmission line or a via end. In some embodiments, the outer conductive layer includes a plurality of outer layer circuit features each having corresponding outer surface circuit feature dimensions. In some embodiments, the outer surface circuit feature dimensions are smaller than the inner core structure circuit feature dimensions. In some embodiments, the outer layer comprises a plurality of different materials blended together, each of the different materials having a different coefficient of thermal expansion value, and the outer layer has a second composite coefficient of thermal expansion value. In some embodiments, the outer layer comprises a plurality of second dielectric material layers each separated by a conductive layer. In some embodiments, the conductive layers separating each of the plurality of second dielectric material layers are selectively interconnected by a plurality of conductive microvia. In some embodiments, the outer conductive layer is coupled to the outer layer using one of a semi-additive process, an advanced modified semi-additive process or fully additive process. In some embodiments, the inner core structure is fabricated using standard printed circuit board processes and the outer layer and the outer conductive layer are fabricated using integrated circuit substrate processes.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a hybrid PCB system. Those of ordinary skill in the art will realize that the following detailed description of the hybrid PCB system is illustrative only and is not intended to be in any way limiting. Other embodiments of the hybrid PCB system will readily suggest themselves to such skilled persons having the benefit of this disclosure.

Reference will now be made in detail to implementations of the hybrid PCB system as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
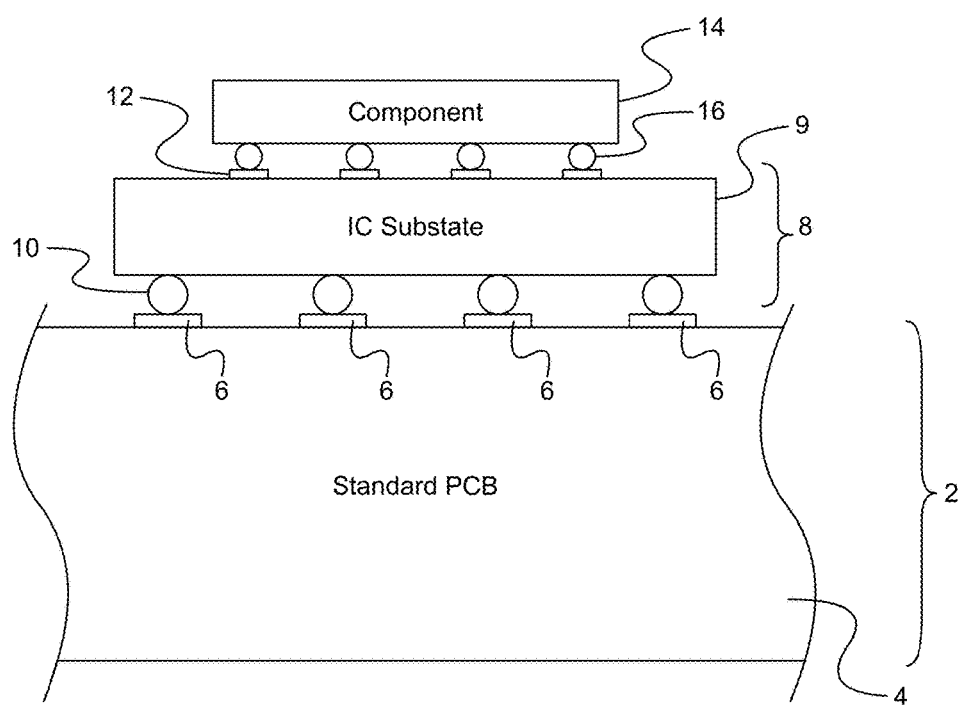
FIG. 1 illustrates a conventional configuration for interconnecting a smaller featured electronic component to a larger featured standard PCB using an IC substrate.
Figure 2:
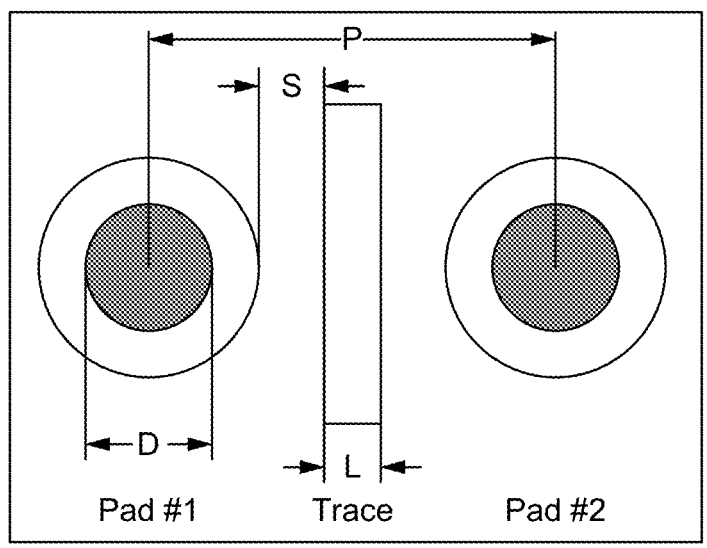
FIG. 2 illustrates a graphical representation of some of the conductive interconnects, circuit feature characteristics.

FIG. 2 illustrates a graphical representation of some of the conductive interconnects, circuit feature characteristics. Shown are two contact pads, pad 1 and pad 2, and a line trace. The pitch P is the distance between the center of two adjacent pads, for example the distance between the center of pad 1 and the center of pad 2. A line wide L is the width of a line trace. Space S is the distance between adjacent circuit features, for example the distance between the edge of the pad 1 and the edge of the line trace. Width D represents the via diameter.

Figure 3:
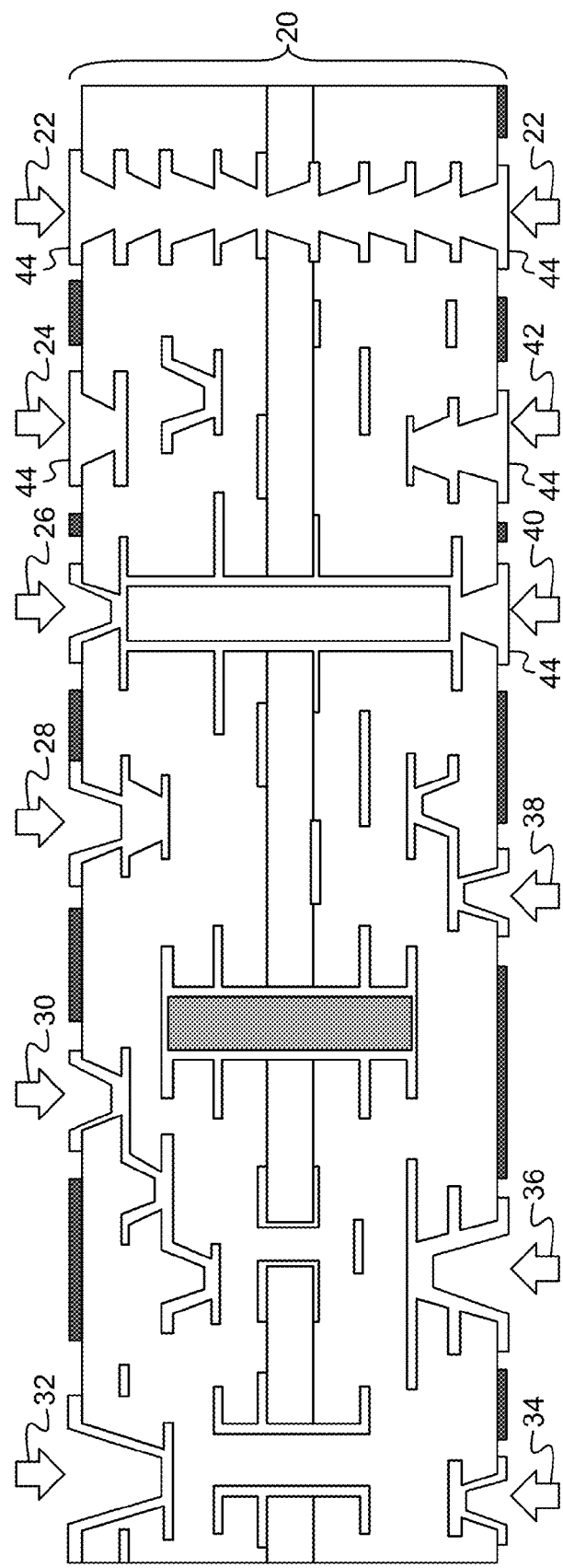
FIG. 3 illustrates a cut out side view of an exemplary inner core structure and a variety of via technologies according to some embodiments.

The hybrid PCB system includes an inner core structure made of a laminated stack, and outer hybrid redistribution layers fabricated directly onto the inner core structure. The inner core structure is fabricated using standard PCB technologies, whereas the hybrid redistribution layers are fabricated using wafer level packaging and IC substrate technologies. FIG. 3 illustrates a cut out side view of an exemplary inner core structure and a variety of via technologies according to some embodiments. The inner core structure 20 is a laminated stack having a plurality of non-conductive layers and a plurality of conductive layers. The inner core structure has high density interconnects within the buildup. The inner core structure has multiple layers, for example 2-50 layers, each layer made of prepreg, core (base) material, or conductive interconnects/planes, preferably made of copper. In the exemplary configuration shown in FIG. 3, the inner core structure includes conductive layers L1-L10 within intervening non-conductive layers, labeled as prepreg and core. The outer most conductive layers, such as conductive layers L1 and L10, include contact pads 44. The exemplary inner core structure 20 is fabricated through a succession of lamination cycles applied to either side of the core layer. After each lamination step, the outer most conductive layer of the laminated stack is pattern etched to form electrically conductive interconnects. A conductive layer can be formed, for example, from a copper foil or laminate, where a laminate includes a non-conductive layer such as base material and a conductive layer on one or both sides of non-conductive layer. In some embodiments, a conductive layer is representative of a multilayer buildup that can include many interspersed conductive and non-conductive layers.

Each non-conductive layer is made of a non-conductive, insulating material, such as prepreg or base material. A base material is an organic or inorganic material used to support a pattern of conductor material. Base material and prepreg each include resin and glass cloth, but the resin in base material is already fully cured and as such does not flow during lamination. The resin in prepreg is only partially cured and therefore flows during lamination. A function of prepreg is to mechanically bind yet electrically insulate adjacent conductive layers.

Any number or type of vias or microvias can be formed to provide interconnections between the various conductive layers. Examples of such via types include, but are not limited to, every layer interconnect (ELIC) 22, solid via 24, via in pad 26, stacked via 28, staggered via 30, skip via 32, laser via 34, telescopic via 36, staggered via 38, via in pad 40 and stacked solid via 42. Each of these via types is shown for exemplary purposes only. It is understood that one, some or all of these types can be used in a given inner core structure, as determined by the specific application. It is also understood that the specific conductive interconnects, vias and microvias shown in FIG. 3 are again for exemplary purposes only and can be varied based on the specific application.

The inner core structure 20 is fabricated using standard PCB technologies. 300 micron pitch with 30 micron line space are starting to be developed. This is due to the chip sets (BGAs, CSPs, WLP) having connectors (solder bumps for example) now at those pitches. In standard PCB technologies, typically there are stacked non-conductive layers that have the same coefficient of thermal expansion, and the line/spaces are normally smaller in the inner layers than the outer layers. The conductive interconnect feature characteristics have a minimum size restriction due to the standard PCB technologies. The minimum pad pitch for the inner core structure is 400 microns, the minimum line width L is 40 microns and the minimum space S is 40 microns. Using the approach of the hybrid PCB system, the outer layers can have the same or smaller line/space and pitch as the inner layers, and the features of the inner layers can be larger than the features of the outer layers. A primary mechanism for accomplishing these aspects is the use of the hybrid outer layer material with or without the buffer layer material, and with higher ductility copper in the microvias than standard PCBs.

Figure 4:
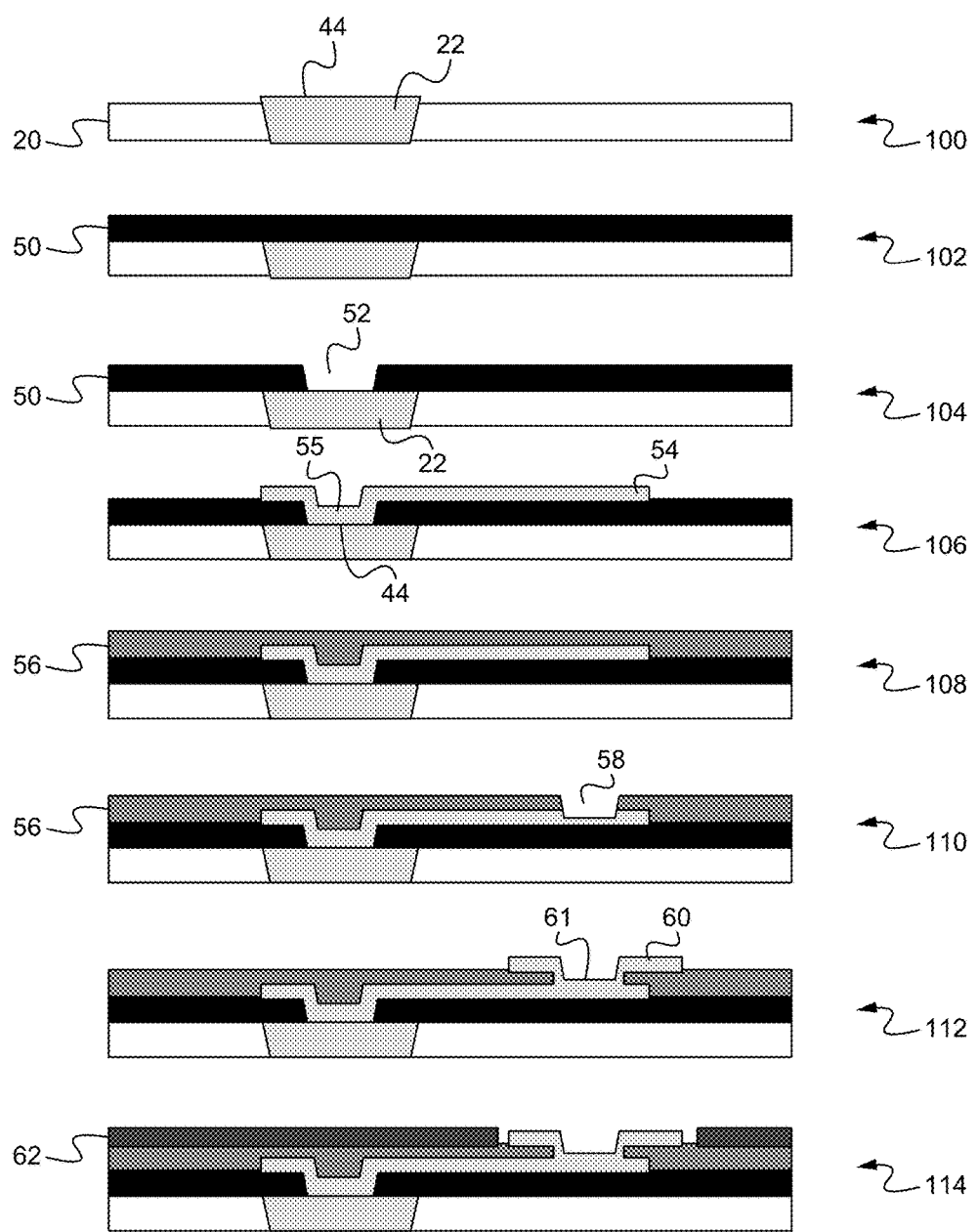
FIG. 4 illustrates a process for fabricating the hybrid PCB system according to some embodiments.

FIG. 4 illustrates a process for fabricating the hybrid PCB system according to some embodiments. Each of the process steps shows a cut out side view of the hybrid PCB system at various steps in the fabrication process. At the step 100, an inner core structure is fabricated using standard PCB technology. The inner core structure can be any standard PCB including, but not limited to, a high density interconnect (HDI) PCB or an ELIC PCB, such as the inner core structure 20 shown in FIG. 3. FIG. 4 shows only a portion of the hybrid PCB system. For example, the inner core structure 20 is shown only in block form, and only a single via 22/contact pad 44 is shown for ease of illustration. In general, the inner core structure has 'N' electrically and mechanically connected layers, which may or may not be symmetrically configured. The inner core structure may or may not have an outerlay finishing, such as solder mask, or surface finishes, such as Organic Surface Protectant (OSP), Electroless Nickel Immersion Gold (ENIG), etc. The solder mask may be considered for leveling and/or improved adhesion to the next buildup layer. Outer layer surface via(s) can be filled with conductive material such as copper (by plating or conductive ink) or silver (by conductive ink) or anisotropic conducting material such as a conductive polymer material or a dielectric polymer fill which is then plated over with copper. It is understood that other techniques for filling the vias can be used.

At the step 102, a first dielectric layer 50, also referred to as a buffer layer, is applied to the exposed surface of the inner core structure 20. In the ideal case, the combined expansion forces between interfaces should be as close to equal as possible so at to minimize shear forces on the layers. The first dielectric layer is an electrically non-conducting material. In some embodiments, the first dielectric layer is filled, such as glass filled, ceramic particle filled or nano-particle filled. In other embodiments, the first dielectric layer is not filled, such as a solder mask type material. The first dielectric layer is compatible with either laser drilling or photolithography processes. The first dielectric layer may be applied to fill the gaps between the outer layer circuit features of the inner core structure 20, such as copper line traces or contact pads, which forms a planar or flat surface. In this manner, the first dielectric can be used to address the issue of co-planarity. The circuit features, such as a pad, trace, or via end, extend above the surface of the inner core structure. This may lead to image transfer in subsequently added layers, which negatively impacts the planarity of the top surface. It is desired to mount the electronic component to as flat a surface as possible. The first dielectric layer can be used to fill in the gaps between circuit features, thereby minimizing image transfer at the top surface of the hybrid PCB system. The first dielectric material can either be flush with the circuit features on the outer layer of the inner core structure 20 or slightly above the circuit features. The first dielectric layer can be a liquid or a film. Application of the first dielectric layer forms a flat or planar surface as a base to start a redistribution layer build up. The first dielectric material may need to set, harden or crosslink by application of temperature and/or light such as ultraviolet. The first dielectric material may be compatible with photolithographic processing or laser drilling. In some embodiments, a laser with a wavelength in the UV range or the IR range is used. The laser source can be gas or solidstate. The pulse length is between femto-second and micro-second. The first dielectric material adheres mechanically and/or chemically to the inner core structure either naturally or with use of an adhesion promoting material. The first dielectric material can also be considered a passivation layer. Although the first dielectric layer is shown as a single layer, the first dielectric layer is representative of one or more layers made of the first dielectric material.

At the step 104, a via hole 52 is formed in the first dielectric layer 50 to expose a portion of the conductive contact pad 44 on the outer layer of the inner core structure 20. One via hole 52 is formed for each contact pad 44. The via hole diameter is smaller than the contact pad diameter. In some embodiments, the diameter of the via hole is less than or equal to 50 microns. The via hole 52 is formed by either photolithography processing or using a laser, such as a UV laser or a CO2 laser. The via hole 52 may be cleaned with plasma or chemicals typical of PCB or IC substrate manufacturing.

At the step 106, circuit features for redistribution of the circuit path are formed by metalization and patterning. Conductive interconnects 54 are formed by depositing conductive material, such as copper onto the first dielectric layer 50 and into the via hole 52. The deposited conductive material is then patterned and etched to form the desired circuit features. The conductive material deposited in the hole via forms a capture pad 55 which is electrically and mechanically coupled to the contact pad 44 on the inner core structure 20. The formed conductive interconnects are mechanically and electrically coupled to the capture pad 55. In some embodiments, the conductive material is deposited by PVD (Physical Vapor Deposition), CVD (Chemical Vapor Deposition), electroless copper seed layer followed by electrolytic copper plating, or direct copper plating. Patterning for the circuit features (line/space, pads, etc) can be done using a semi-additive process (SAP), an advanced modified semi-additive process (amSAP) or fully additive process which may include ink jetting or other fully additive metal deposition process. In a fully additive process, copper is only deposited where the conductive interconnects are to be positioned, there is no patterning and etching. These patterning processes are indicative of patterning processes used in IC substrate and wafer level packaging processes. In contrast, patterning using standard PCB processes is done by a fully subtractive process. In a fully subtractive process, a layer of copper is deposited or applied as a foil, and then the copper layer is patterned and etched to form the conductive interconnects. Fully subtractive processing is not capable of forming the fine circuit feature dimensions in the hybrid redistribution layers. However, the semi-additive process (SAP), the advanced modified semi-additive process (amSAP) and the fully additive process are more costly than the fully subtractive process. Via structures can be similar to those described in FIG. 3 including, but not limited to, stacked, staggered, filled, unfilled, concave and convex.

At the step 108, a second dielectric layer 56, also referred to as an outer layer, is applied over conductive layer 54 and the first dielectric layer 50. The second dielectric layer is an electrically non-conducting material. The second dielectric layer may or may not be glass filled, ceramic particle filled or nano-particle filled. The second dielectric layer is compatible with either laser drilling or photolithography processes. Although the second dielectric layer is shown as a single layer, the second dielectric layer is representative of one or more layers made of the second dielectric material. The second dielectric material can be a dielectric material with a warp and fill CTE of less than 20 ppm at 3-6 C/s ramp rate, b/t 30 and 260 C, and a Tg>160, by DMA. Preferred warp and fill CTE<15 ppm.

At the step 110, a via hole 58 is formed in the second dielectric layer 56 to expose a portion of the conductive interconnect 54. One via hole 58 is formed for each capture pad 55. The diameter of the via hole 50 is equal to or smaller than the diameter of the capture pad 55. In some embodiments, the diameter of the via hole 58 is less than or equal to 30 microns. The via hole 58 is formed by either photolithography processing or using a laser, such as a UV laser or a CO2 laser. The via hole 58 may be cleaned with plasma or chemicals typical of PCB or IC substrate manufacturing. At the first dielectric layer 50 and the second dielectric layer 56, the layer thicknesses become thinner than the non-conducting layers in the inner core structure. Thinner layers enable smaller diameter vias to pass through the entire thickness. In some embodiments, a thickness of the first dielectric layer is about 40, which enables a via having a diameter of about 50 microns. This compares to typical non-conducting layers in the inner core structure having thicknesses of about 60 and corresponding via diameters of about 75 microns. In some embodiments, a thickness of the second dielectric layer is about 25 microns which enables a via diameter of about 40 microns. Smaller via diameters miniaturize the circuit feature dimensions on the outer surface of the hybrid redistribution layers, for example smaller line traces and smaller pads, while keeping the circuit feature dimensions on the inner core structure larger.

At the step 112, circuit features for redistribution of the circuit path are formed by metalization and patterning. Conductive interconnects 60 are formed by depositing conductive material, such as copper, onto the second dielectric layer 56 and into the via hole 58. The deposited conductive material is then patterned and etched to form the desired circuit features. The conductive material deposited in the via hole 58 forms a capture pad 61 which is electrically and mechanically coupled to the conductive interconnect 54. The conductive interconnects 60 can be formed in a manner similar to the conductive interconnects 54 in step 106, where the circuit feature dimensions formed in the step 112 are equal to or less than the circuit feature dimensions formed in the step 106. In some embodiments, additional conductive layers can be formed by repeating the steps 108-112.

At the step 114, solder mask 62 is applied to protect the outer layer circuitry except those pads, such as capture pad 61, that are needed for electronic component assembly or electrical testing. The solder mask can be placed over the pad opening (known as solder mask defined pad) or can be placed within an annular ring of the pad (known as metal or copper defined pad). Bumps on the electronic component (not shown) can be connected to the exposed pads.

Although only a single pad 61 is shown on the outer surface of the hybrid redistribution layers, this is merely for exemplary purposes. The hybrid redistribution layers are configured such that the conductive interconnects, and in particular the contact pads, on the outer surface of the hybrid redistribution layers match corresponding interconnects, such as bumps, of the electronic components mounted to the hybrid PCB system. An electronic component can be an individual device, an IC and IC packaging, a module, or one or more ICs and supporting devices such as amplifiers, RF devices, sensors, etc.

FIG. 4 shows an asymmetrical configuration in which the hybrid redistribution layers are formed on one side (top side as shown in FIG. 4) of the inner core structure. Alternatively, other hybrid redistribution layers can be formed on the opposite side of the inner core structure. The hybrid redistribution layers on either side of the inner core structure can be symmetrical or asymmetrical.

The first and second dielectric layers, and the finer circuit features of the intervening conductive layers form the hybrid redistribution layers. The dimensions of the circuit features decrease from the conductive layers contacting the inner core structure to the conductive layers contacting an attached electronic component, thereby enabling interconnection of the smaller sized electronic component with the larger sized inner core structure without use of a separate IC substrate or interposer. Additionally, the hybrid redistribution layers provide conductive interconnect fan out from the tightly spaced bumps of the electronic component. Each bump of the attached electronic component is connected to a pad on the top surface of the hybrid redistribution layers. The bumps often form dense arrays, for example 25×25 bump arrays, and therefore there is a corresponding dense array of pads on the top surface. It is straightforward to extend interconnect traces from the outer pads of the array along the top surface. These interconnects "fan out" from the attached electronic component providing off-component interconnect capability. However, for high density BGAs, the bumps, and therefore the pads, are spaced too closely together (pitch is too small) to allow interconnects to fit between the pads to access the inner pads in the array. To provide fan out interconnects for the remainder of the pads/bumps, the inner pads are typically formed on the top of vias which connect to lower conductive interconnect layers within the hybrid redistribution layers. Conductive interconnects can then be connected to the via at one or more layers down from the top surface. Subsequent vias can be formed down through as many additional layers as necessary to provide fan out interconnections for each of the pads/bumps of the attached electronic component. The larger the array of bumps on the attached electronic component, the greater the number of layers to provide sufficient number of fan out paths for all of the bumps/pads. The pitch, line and spacing dimensions can be increased from layer to layer moving toward the inner core structure, thereby providing a transition from the smaller dimensions at the top surface needed for interfacing with the high density interconnections of the attached electronic component to the larger dimensions at the inner core structure. For example, the bumps may have at 0.2 mm or 0.3 mm pitch (center-to-center) whereas the pitch of the pads/vias at the inner core structure is 0.75-1.00 mm. In this manner, the transition from smaller dimensioned interconnects of an attached electronic component to larger dimensioned interconnects of the inner core structure is accomplished using additional layers laminated to the overall PCB stack up. This contrasts with the use of an IC substrate that is a separate component attached as an intermediary between the attached electronic component and the inner core structure.

As described above, the density of the high density BGA is too high to allow sufficient space for a routing channel between adjacent bumps. With the greater pitch at the inner core structure, one or more routing channels can be formed between adjacent pads/vias for the fan out interconnects. It is understood that where the hybrid redistribution layers are made of multiple layers, at each layer the dimensions can be increased, moving away from the dimensions of the attached electronic component and eventually providing sufficient pitch for routing channel formation on one more layers of the hybrid redistribution layers.

By adding the hybrid redistribution layers as additional layers laminated to a standard PCB (inner core structure), an IC substrate is eliminated. However, since the attached electronic component has high density interconnects, registration between the individual bumps of the electronic component and the corresponding contact pads on the hybrid redistribution layer can become an issue if thermal-mechanical stress is not managed. To manage the thermal-mechanical stress, the hybrid redistribution layers are further configured such that the dielectric layers are made of different materials. The dielectric layers of the hybrid redistribution layers are also made of different materials than the non-conductive layers of the inner core structure. Different materials are used at different layers to relief the thermal-mechanical stresses and registration burden. Designing the outer redistribution layers as hybrid redistribution layers effectively dissipates stress at the electronic component attach site and distributes the thermal-mechanical stress to the interface between the inner core structure of the standard PCB and the hybrid distribution layers, as well as between the various hybrid layers within the hybrid redistribution layers, where applicable.

Thermal-mechanical stress, also referred to as residual stress, of a material is a function of the elastic modulus, the change in temperature, the coefficient of thermal expansion (CTE) and Poisson's ratio. The first dielectric material has two characteristics. First, the first dielectric material has a lower elastic modulus than the inner core structure and the second dielectric material. A low elastic module signifies a more compliant material, essentially enabling more movement of one material relative to another. If the first dielectric layer were more rigid than the inner core structure, then the first dielectric layer would transmit some thermal-mechanical stress force (from the inner core structure) into the second dielectric layer. However, the first dielectric layer is configured to be softer (lower elastic modulus) than both the inner core structure and the second dielectric layer thereby enabling the inner core structure to expand slightly while maintaining the second dielectric layer in position. In this case, a softer first dielectric layer absorbs stress induced by an expanding/contracting inner core structure. In some embodiments, the second dielectric material has an elastic modulus of 50GPa or less. Second, the first dielectric material has a lower coefficient of thermal expansion (CTE) than the inner core structure, but a greater CTE than the outer layer. Thermal expansion is the tendency of matter to change in shape, area, and volume in response to a change in temperature. The degree of expansion divided by the change in temperature is called the material's CTE and generally varies with temperature. As used herein, reference to a material's CTE is used to reference either a specific CTE value at a specific temperature or to the rate of change of the CTE. Similar to CTE, the elastic modulus varies with temperature.

The glass-liquid transition, or glass transition for short, is the reversible transition in materials from a hard and relatively brittle "glassy" state into a molten or rubber-like state, as the temperature is increased. The glass transition temperature Tg of a material characterizes the range of temperatures over which this glass transition occurs. Each material has a specific glass transition Tg. The rate of change for the CTE of the material changes at the glass transition Tg. At temperatures lower than the glass transition Tg the material has a first CTE rate of change, and at temperatures greater than the glass transition the material has a second CTE rate of change, which is greater than the first CTE rate of change. Similar to CTE, for each material there is a first elastic modulus below the glass transition temperature Tg and a second elastic modulus different than the first elastic modulus above the glass transition temperature Tg.

For materials made of a single type of material, there is a single CTE. However, for materials that are blended from multiple different types of materials, such as a mixed resin material, the resulting blended material may have multiple glass transition temperatures Tg. Blended materials with multiple glass transition temperatures Tg have multiple corresponding CTEs. In the case of a blending material, the blended material can be characterized by a composite CTE. As applied to the first and second dielectric layers, each can be made of a single material having a single CTE or as a blend of materials having a composite CTE. Reference herein to a CTE is intended to refer to either case.

The CTE for the non-conductive layers of the inner core structure is referred to as CTE(A), the CTE of the first dielectric layer is referred to as CTE(B), and the CTE of the second dielectric layer is referred to as CTE©. The inner core structure, the first dielectric layer and the second dielectric layer have cascading CTEs where CTE(A)>CTE(B)>CTE©. These CTE and elastic modulus characteristics allow a mismatch in strains between the inner core structure and the second dielectric layer. It is understood that more than two different types of dielectric layers can be used, where all dielectric layers have cascading CTEs in the manner described.

The weak point in the mechanical and electrical connection between the attached electrical component and the top surface of any PCB type build up is the solder connection between a bump on the attached electrical component and a top surface contact pad of the build up. If standard PCB materials were to be used to form the redistribution layer, then the stress due to CTE mismatch between the PCB and crystalline semiconductor substrate is applied entirely at this point of contact. The hybrid redistribution layers progressively dissipate stress across the different material layers of the buffer layer (first dielectric layer) and the outer layer (second dielectric layer), thereby minimizing stress applied at the solder connection.

In some embodiments, the first dielectric layer is not included. Instead, the second dielectric layer (outer layer) is coupled directly to the inner core structure. In this case, the thickness of the second dielectric material is greater than those embodiments where there is also a first dielectric layer (buffer layer).

The hybrid PCB system leverages redistribution type technologies used in flip-chip and WLCSP (Wafer Level Chip Scale Packaging), new materials with lower CTEs and higher glass transition temperatures Tg,and new processes such as semi-additive process (SAP), an advanced modified semi-additive process (amSAP) or fully additive process to form metal structures. The hybrid redistribution layers provide an interface, or footprint matching, for disparate circuit feature dimensions integrated onto a standard PCB stack up. The hybrid redistribution layers use a hybrid material stack up to enable the footprint matching and thermal-mechanical stress dissipation while overcoming the registration issue.

The present application has been described in terms of specific embodiments incorporating details to facilitate the understanding of the principles of construction and operation of the hybrid PCB system. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A printed circuit board comprising:
    a. an inner core structure comprising a laminated stack of a plurality of non-conductive layers and a plurality of conductive layers, wherein the plurality of non-conductive layers have a first coefficient of thermal expansion value and a first elastic modulus value;
    b. a buffer layer laminated to the inner core structure, wherein the buffer layer comprises a first dielectric material having a second coefficient of thermal expansion value less than the first coefficient of thermal expansion value, further wherein the buffer layer has a second elastic modulus value;
    c. an intermediate conductive layer coupled to the buffer layer;
    d. an outer layer coupled to the intermediate conductive layer and the buffer layer, wherein the outer layer comprises a second dielectric material having a third coefficient of expansion value less than the second coefficient of thermal expansion value, further wherein the outer layer has a third elastic modulus value, wherein the second elastic modulus value is less than the first elastic modulus value and the second elastic modulus value is less than the third elastic modulus value; and
    e. an outer conductive layer coupled to the outer layer.

2. The printed circuit board of claim 1 wherein the plurality of conductive layers includes an inner core structure outer surface conductive layer, and the intermediate conductive layer is coupled to the inner core structure outer surface conductive layer by one or more first conductive microvias.

3. The printed circuit board of claim 2 wherein the outer conductive layer is coupled to the intermediate conductive layer by one or more second conductive microvias.

4. The printed circuit board of claim 3 wherein the inner core structure outer surface includes a plurality of inner core structure circuit features each having corresponding inner core structure circuit feature dimensions, wherein each of the plurality of the inner core structure circuit features comprise one of a first contact pad diameter, a first trace transmission line width or a first via end diameter.

5. The printed circuit board of claim 4 wherein the outer conductive layer includes a plurality of outer layer circuit features each having corresponding outer surface circuit feature dimensions, wherein each of the plurality of the outer layer circuit features comprise one of a second contact pad diameter, a second trace transmission line width or a second via end diameter.

6. The printed circuit board of claim 5 wherein the outer surface circuit feature dimensions are smaller than the inner core structure circuit feature dimensions.

7. The printed circuit board of claim 1 wherein the buffer layer comprises a plurality of different materials blended together, each of the different materials having a different coefficient of thermal expansion value, and the buffer layer has a second composite coefficient of thermal expansion value.

8. The printed circuit board of claim 1 wherein the outer layer comprises a plurality of different materials blended together, each of the different materials having a different coefficient of thermal expansion value, and the outer layer has a third composite coefficient of thermal expansion value.

9. The printed circuit board of claim 1 wherein the buffer layer comprises a plurality of first dielectric material layers each separated by a conductive layer.

10. The printed circuit board of claim 9 wherein the conductive layers separating each of the plurality of first dielectric material layers are selectively interconnected by a plurality of conductive micovias.

11. The printed circuit board of claim 1 wherein the outer layer comprises a plurality of second dielectric material layers each separated by a conductive layer.

12. The printed circuit board of claim 11 wherein the conductive layers separating each of the plurality of second dielectric material layers are selectively interconnected by a plurality of conductive micovias.

13. The printed circuit board of claim 1 wherein the intermediate conductive layer is applied to the buffer layer and the outer conductive layer is coupled to the outer layer using one of a semi-additive process, an advanced modified semi-additive process or fully additive process.

14. The printed circuit board of claim 1 wherein the inner core structure is fabricated using standard printed circuit board processes and the buffer layer, the intermediate conductive layer, the outer layer and the outer conductive layer are fabricated using integrated circuit substrate processes.

15. A printed circuit board comprising:
a. an inner core structure comprising a laminated stack of a plurality of non-conductive layers and a plurality of conductive layers including an inner core structure outer surface conductive layer, wherein the inner core structure outer surface includes a plurality of inner core structure circuit features each having corresponding inner core structure circuit feature dimensions, further wherein each of the plurality of the inner core structure circuit features comprise one of a first contact pad diameter, a first trace transmission line width, or a first via end diameter, wherein the plurality of non-conductive layers have a first coefficient of thermal expansion value;
b. an outer layer coupled to the inner core structure, wherein the outer layer comprises a dielectric material having a second coefficient of expansion value less than the first coefficient of thermal expansion value; and
c. an outer conductive layer coupled to the outer layer, wherein the outer conductive layer includes a plurality of outer layer circuit features each having corresponding outer surface circuit feature dimensions, further wherein each of the plurality of the outer layer circuit features comprise one of a second contact pad diameter, a second trace transmission line width, or a second via end diameter, wherein the outer surface circuit feature dimensions are smaller than the inner core structure circuit feature dimensions.

16. The printed circuit board of claim 15 wherein the plurality of non-conductive layers have a first elastic modulus value and the outer layer has a second elastic modulus value, further wherein the second elastic modulus value is less than the first elastic modulus value.

17. The printed circuit board of claim 15 wherein the outer conductive layer is coupled to the inner core structure outer surface conductive layer by one or more conductive microvias.

18. The printed circuit board of claim 15 wherein the outer layer comprises a plurality of different materials blended together, each of the different materials having a different coefficient of thermal expansion value, and the outer layer has a second composite coefficient of thermal expansion value.

19. The printed circuit board of claim 15 wherein the outer layer comprises a plurality of second dielectric material layers each separated by a conductive layer.

20. The printed circuit board of claim 19 wherein the conductive layers separating each of the plurality of second dielectric material layers are selectively interconnected by a plurality of conductive micovias.

21. The printed circuit board of claim 15 wherein the outer conductive layer is coupled to the outer layer using one of a semi-additive process, an advanced modified semi-additive process or fully additive process.

22. The printed circuit board of claim 15 wherein the inner core structure is fabricated using standard printed circuit board processes and the outer layer and the outer conductive layer are fabricated using integrated circuit substrate processes.

* * * * *